US005194694A

United States Patent [19]

Hendel et al.

[11] Patent Number: 5,194,694

[45] Date of Patent: Mar. 16, 1993

[54] BASE TO A HOUSING FOR AN ELECTRICAL COMPONENT

[75] Inventors: Horst Hendel, Berlin; Herbert Mitschik, Geretsried; Dietrich Schwarz, Munich, all of Fed. Rep. of Germany

[73] Assignee: Siemens Aktiengesellschaft, Munich, Fed. Rep. of Germany

[21] Appl. No.: 712,467

[22] Filed: Jun. 10, 1991

[30] Foreign Application Priority Data

Jul. 27, 1990 [DE] Fed. Rep. of Germany ... 9011111[U]

[51] Int. Cl.[5] .......................... H05K 5/06; B32B 31/06

[52] U.S. Cl. .................................. 174/52.3; 264/261; 264/272.11; 264/279

[58] Field of Search ................... 264/261, 262, 272.11, 264/273, 279; 174/52.1, 52.2, 52.3, 52.4; 249/107, 109, 110

[56] References Cited

U.S. PATENT DOCUMENTS 4,246,437 1/1981 Frey et al. .
4,349,693 9/1982 Hinrichs .
4,366,345 12/1982 Jälgle ................................ 174/52.3
4,810,831 3/1989 Hendel .

*Primary Examiner*—Leo P. Picard
*Assistant Examiner*—Bot Ledinh
*Attorney, Agent, or Firm*—Hill, Steadman & Simpson

[57] ABSTRACT

To seal the gaps and openings in the housing of an electrical component, the outside wall of the base of the housing is provided with filling reservoirs from which lead distributing channels leading to sealing locations to be sealed by sealing compound. The distributing channels are subdivided into sub-channels by centrally extending distributing ribs so that the sub-channels provide an increased capillary action for sealing compound deposited into the filling reservoirs.

15 Claims, 2 Drawing Sheets

BASE TO A HOUSING FOR AN ELECTRICAL COMPONENT

BACKGROUND OF THE INVENTION

1. Field of the Invention

The present invention is directed generally to a housing for an electrical component such as a relay or the like and, more particularly, to a base or bottom wall of the housing provided with openings for terminal pins and gaps in the housing which are to be sealed.

2. Description of the Related Art

It is often necessary that electromechanical components, such as relays, be sealed in a housing which is liquid tight, or wash-fast, to avoid the penetration of wash solutions and soldering agents into the housing when the printed circuit boards on which the components are mounted are subject to corresponding treatments. Openings in the floor, or base, of the housing through which the terminal pins are conducted to the outside are usually to be sealed, as well as the edge gap between the base and the housing cap which is placed thereover.

It is already known to provide a network of grooves or channels in the outside surface of the housing base extending between one or more dosing locations and the sealing locations. Casting resin is deposited at the dosing locations and is conducted to the sealing locations via capillary action (as disclosed, for example in German Patent Document 28 51 329 C2 and German Patent Document 30 26 371 C2).

It is further known from European Published Application 0 262 622 A1, to provide raised distribution ribs on an otherwise planar outside surface of a housing base. The raised distributing ribs likewise develop a capillary action via the sharp inside edge between the distributing rib and the base surface, and thus convey the casting compound from dosing locations to sealing locations. The distributing action known capillary systems, however, is not adequate for certain housing designs.

SUMMARY OF THE INVENTION

An object of the present invention is to provide especially fast and reliable distribution of the sealing compound from one or more filling locations to locations to be sealed on a housing for an electrical component. This is guaranteed by an improved surface structure on an appertaining housing wall.

This and other objects and advantages of the invention are achieved by a housing which includes the following features:

a) at least one filling reservoir for receiving casting compound is formed into an outside surface of the housing wall;

b) at least one distribution channel extends from the at least one filling reservoir to at least one sealing location;

c) a distributing rib extends centrally in at the at least one distributing channel parallel to the sidewalls of the distributing channels; and d) a sharp inside edge is formed in the distributing channel between the floor of the channel and either the channel wall or the distributing rib.

According to the invention, elements of capillary systems are combined by providing an additional distributing rib in the distributing channels so that a system of double channels results. In this way, relatively narrow sub-channels which have a high capillary action are obtained, these sub-channels, however, together convey a greater quantity of casting compound and thus enable a faster distribution of the casting compound and an improved sealing of the openings in the housing.

As an expedient development in the present invention, the distributing channels discharge from the filling reservoirs at intervals of approximately equal size into an all around marginal channel having a width which is preferably smaller than the width of the distributing channels. It is especially expedient that the distributing ribs in the distributing channels are continued into the marginal channel up to the outside wall thereof. This outside wall of the marginal channel is usually formed by the edge of the housing cap after it has been put in place on the base or bottom wall or the like of the housing and where an edge gap is formed which must be sealed.

Special end channels which branch off from a distributing channel or from the marginal channel are provided in the region of individual sealing locations, such as where certain terminal elements of the component extend through openings in the housing wall. It is thereby advantageous that the width of the capillary paths decrease proceeding from the perspective filling reservoir via the distributing channels to the marginal channels or to the end channels and especially good capillary action is obtained in this way.

Since the filling reservoirs are to a large extend emptied by suction action due to the special structure of the capillary system, the quantity of casting compound which is required may be kept quite small. A further improvement in the capillary action is achieved when the bottom surfaces of the distributing channels and the respective lateral surfaces of the distributing channels and the distributing ribs are roughened.

Alternate embodiments may include more than one filling reservoir in the housing wall. Instead of a rib that is in the middle of the channel, it is possible that the rib could be to one side or the other, or that two or more ribs may extend along each hand. The sharp inside edges which aid capillary action may be provided at the meeting of the channel floor and the rib, as well as at the meeting of the floor and the channel walls. It is also contemplated that the width of the sub-channels may vary along their length instead of being constant, so that a tapering of the sub-channels is provided. It is also possible that side or top walls of the housing be provided with the present sealing arrangement.

The invention shall be set forth in greater detail below with reference to exemplary embodiments shown in the drawings.

DESCRIPTION OF THE PREFERRED EMBODIMENTS

Figure 1:
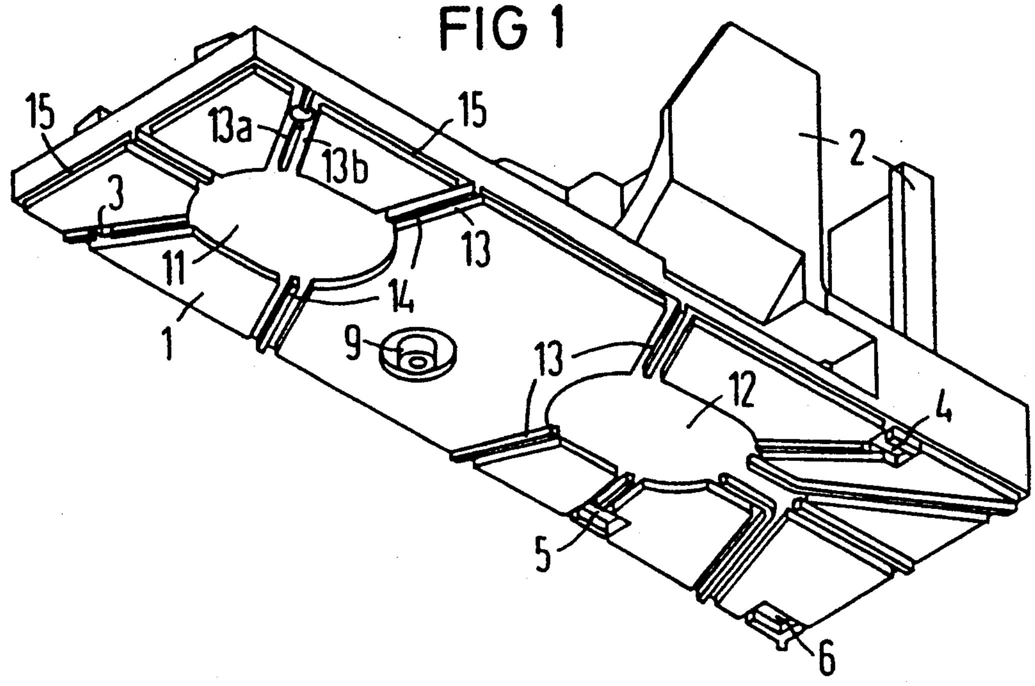
FIG. 1 is a bottom perspective view of a base or floor part of a relay housing.
Figure 2:
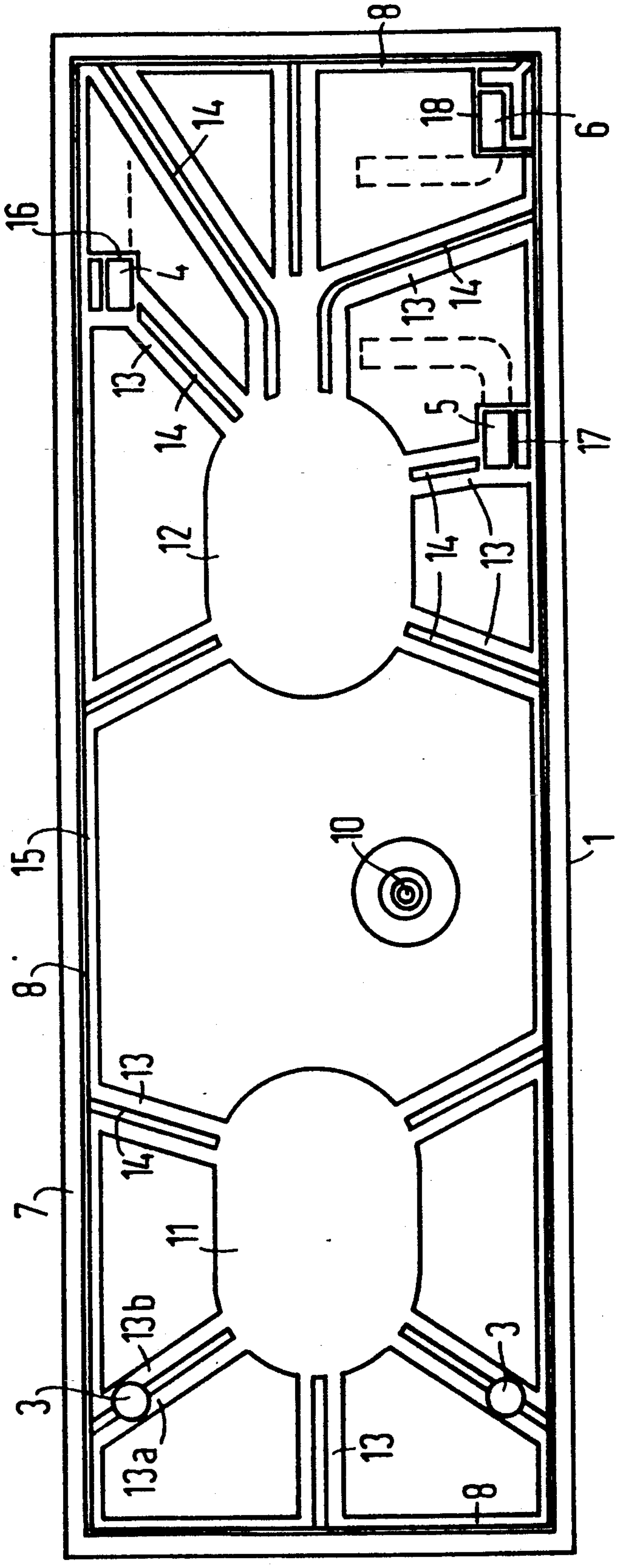
FIG. 2 is a bottom plan view of a relay housing having the base member shown in FIG. 1 and a housing cap mounted thereover.

A base member 1 for a relay housing is shown in FIGS. 1 and 2 which is generally flat and has an upper side provided with projections 2 for fastening a relay system (not shown). Other arrangements of projections or recesses for accommodating the electrical component are, of course, possible. The base member 1 has substantially round passages, or openings, 3 extending therethrough for accepting wire-shaped coil terminal pins, and also has rectangular passages 4, 5 and 6 for variously shaped contact terminal elements (shown in phantom) of the relay mounted in the housing. After the terminal pins (which are not shown) have been inserted through the passages 3–6 and after complete assembly of the relay, the passages 3–6 must be sealed with a casting compound. The casting compound must also seal an edge gap 8 which is formed all around the base member 1 between the edge of the base member 1 and a housing cap 7 which has been placed thereover, as shown in FIG. 2. An aeration hole 10 which is formed in a projecting male member 9 is to be sealed in a known way only after curing of the casting compound.

In the embodiment illustrated in FIGS. 1 and 2, two filling reservoirs 11 and 12 are formed into the outside surface of the base member 1 for receiving and distributing casting compound which has been introduced therein to. Distributing channels 13 branch off from the filling reservoirs in directions toward the passages 3, 4, 5 and 6 and in directions toward the edge gap 8. Each of the distributing channels 13 is sub-divided into two sub-channels 13*a* and 13*b* by a distributing rib 14 extending in the middle in a longitudinal direction of the channel 13. Sharp inside edges are formed between the channel 4 and the sidewalls of the distributing channels 13 or, respectively, the distributing ribs 14. This thereby provides double channels which have extremely good capillary action. The depth of the distributing channels roughly corresponds to the width of the sub-channels and amounts to approximately 0.3 to 0.4 mm in a preferred embodiment. However, other dimensions may be beneficial depending upon the viscosity of the casting compound. An all around marginal channel 15 is also formed for distributing the casting compound into the edge gap 8. The width of the marginal channel 15 is less than that of the distributing channels 13 and also smaller than that of the sub-channels 13*a* and 13*b* insofar as possible. An especially beneficial preferred embodiment has a marginal channel 15 having a width of between 0.2 and 0.3 mm.

To guarantee a fast and complete distribution of the casting compound over the entire edge region, the distributing channels 13 are arranged so that they discharge into the marginal channel 15 at approximately equal intervals. Insofar as the distributing channels 13 lead to a passage or opening 3, the distributing ribs are conducted up to the passage 3 and continue on from the passage 3 to the marginal channel 15. In this case, the distributing ribs 14 also extend into the marginal channel 15 up to the outside edge thereof and thus abut the housing cap 7. The casting compound is thus conducted into the edge gap 8 extremely well in this way.

Additional, small end channels 16, 17 and 18 having an especially small width and, thus an especially good capillary action are provided for sealing the relatively large, rectangular passages 4, 5 and 6 through which the contact terminal elements are plugged. These end channels 16, 17 and 18 branch off either from one of the distributing channels 13 or from the marginal channel 8. As a result of the graduated reduction of the channel cross section with increasing distance from the filling reservoir, it is assured that the casting compound is rapidly and completely suctioned from the filling reservoir 11 or 12 and is conveyed to the most remote sealing locations.

Figure 3:
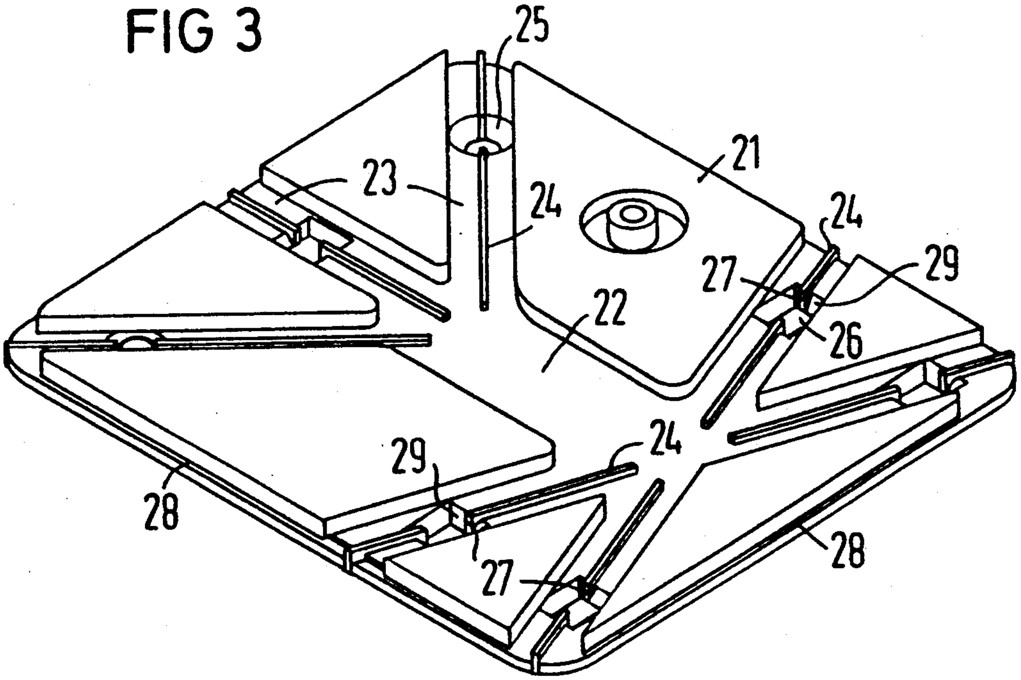
FIG. 3 is a perspective view of a further embodiment of a bottom plate for a relay housing.

A somewhat different embodiment is shown in FIG. 3, in which is illustrated an element of the housing in the form of a bottom plate 21 which, together with a cap (not shown) forms a housing for a relay or similar electrical component. In this embodiment, a central filling reservoir 22 is formed into the surface of the bottom plate 21 and distributing channels 23 having distributing ribs 24 leading from the filling reservoir 22 to various housing passages, or openings, 25 and 26 are provided. Such passages may either be of a round or rectangular shape. The distributing channels 23 with the distributing ribs 24 also lead to a marginal channel 28. As may be seen in FIG. 3, the distributing ribs 24 have perpendicular sections 27 which continue into the passages 25 and 26, the sidewalls 29 of the passages 25 and 26 being somewhat slanted in this region. The capillary action between the rib sections 21 and the respective passage walls 29 thus derive all the way into the passages.

It is also conceivable to sub-divide somewhat broader distributing channels into multiple sub channels with two or more longitudinal ribs. This would result in three or more channels proceeding from a filling reservoir to respective sealing locations to bring the casting compound to the desired locations even faster and more efficiently.

Thus, there is shown and described an arrangement of distributing channels formed in the outside wall of the bottom of a housing in which the distributing channels lead from filling reservoirs to passages and gaps to be sealed. The distributing channels are sub-divided into sub-channels by centrally proceeding distributing ribs so that double channels with a greater capillary action lead to the individual sealing locations.

Although other modifications and changes may be suggested by those skilled in the art, it is the intention of the inventors to embody within the patent warranted hereon all changes and modifications as reasonably and properly come within the scope of their contribution to the art.

We claim:

1. A base for an electric component housing, comprising: a generally planar base member having sealing locations, an inside surface and
an outside surface; at least one filling reservoir adapted to receive a casting compound, said at
least one filling reservoir being formed in said outside surface of said
base member; at least one distribution channel leading from said at least one filling reservoir to
at least one of said sealing locations, said at least one distribution
channel including side walls and a channel floor; a distribution rib proceeding along said at least one distribution channel
substantially in a center of said at least one distribution channel, said
distribution rib being substantially parallel to said side walls of said at
least one distribution channel; and a sharp inside edge defined by said channel floor and one of said distribution
rib and said side walls.

2. A base as claimed in claim 1, wherein said base member includes a surrounding marginal channel, and wherein said at least one distribution channel comprises a plurality of distribution channels, each of said plurality of distribution channels being provided with a distribution rib, said plurality of distribution channels discharging into said surrounding marginal channel at approximately equal intervals.

3. A base as claimed in claim 2, further comprising:

a housing wall mounted on said base member and extending about said base member to form said surrounding marginal channel.

4. A base as claimed in claim 1, wherein said base member includes a surrounding marginal channel with an outer wall, and wherein said distribution rib in said at least one distribution channel extends into said surrounding marginal channel up to said outer wall.

5. A base as claimed in claim 2, wherein said surrounding marginal channel includes an outer wall; and wherein said distribution ribs extend into said surrounding marginal channel up to said outer wall.

6. A base as claimed in claim 1, wherein said base member includes a surrounding marginal channel which is of a narrower width than said at least one distribution channel.

7. A base as claimed in claim 1, further comprising:

an end channel extending to one of said sealing locations.

8. A base as claimed in claim 7, wherein said end channel extends from said at least one distribution channel.

9. A base as claimed in claim 1, wherein said at least one distributing channel decreases in width with increasing distance from said at least one filling reservoir.

10. A base as claimed in claim 1, wherein surfaces of said at least one distributing channels are roughened.

11. A base as claimed in claim 10, wherein said roughened surfaces are floor surfaces of said at least one distribution channel.

12. A base as claimed in claim 10, wherein said roughened surfaces are wall surfaces of said at least one distribution channel.

13. A base as claimed in claim 1, wherein said at least one distribution channel includes further distribution ribs subdividing said at least one distribution channel into more than two sub channels.

14. A housing for an electrical component having leads extending outside the housing, comprising:

a housing cap;

a housing base over which said housing cap is placed to enclose the electrical component, said housing base including openings through which the leads extend, said housing base including an outer surface having:

a recess as a filling reservoir for sealing compound;

a channel leading from said recess to said openings to carry the sealing compound from said recess to said openings by capillary action; and a rib extending longitudinally in said channel to divide said channel into sub-channels.

15. A housing as claimed in claim 14, further comprising:

an additional channel leading from said recess to portions of said housing base abutting said housing cap to carry sealing compound thereto for sealing potential gaps; and an additional rib extending longitudinally in said additional channel.

* * * * *